United States Patent [19]

Levy et al.

[11] 3,936,817
[45] Feb. 3, 1976

[54] THERMOELECTRIC DISPLAY DEVICE

[76] Inventors: Sidney Levy, Oaklyn, N.J.; Abraham Friedman, Brooklyn, N.Y.

[22] Filed: June 6, 1974

[21] Appl. No.: 476,927

[52] U.S. Cl........ 340/336; 340/324 M; 350/160 LC
[51] Int. Cl.² ............................................. G02F 1/18
[58] Field of Search ....................... 340/324 M, 336; 350/160 LC

[56] References Cited
UNITED STATES PATENTS

| | | | |
|---|---|---|---|
| 3,718,382 | 2/1973 | Wysocki et al. ................. | 340/324 M |
| 3,770,961 | 11/1973 | Westell .......................... | 350/160 LC |
| 3,781,865 | 12/1973 | Yamazaki ...................... | 350/160 LC |
| 3,851,318 | 11/1974 | Taylor et al. .................. | 350/160 LC |

Primary Examiner—Marshall M. Curtis
Attorney, Agent, or Firm—Friedman & Goodman, Esqs.

[57] ABSTRACT

A thermoelectric display device is described which includes a thermoelectric element having a surface which exhibits a reversible temperature which is a function of the magnitude and direction of a current passing through the element. The thermoelectric element includes two dissimilar conductors joined in overlapping relation over a predetermined area to form a junction. The junction is advantageously formed by overlapping a p-type semi-conductive layer and an n-type semi-conductive layer, which may or may not be separated in the region of overlap by an electrically conductive layer of material. A cholesteric crystal material is disposed on the surface of the thermoelectric element in the region of the junction thereof in thermally conductive relation therewith, the liquid crystal material being variable between different optical states as a function of the temperature to which the same is exposed. In this manner, the optical state which the display device exhibits is a function of the direction and magnitude of a current passing through the junction of the thermoelectric element and the resulting temperature which manifests itself at the thermoelectric element surface.

8 Claims, 5 Drawing Figures 3,936,817

THERMOELECTRIC DISPLAY DEVICE

BACKGROUND OF THE INVENTION

The present invention generally relates to display devices, and more particularly to a thermoelectric display device which includes a liquid crystal material in thermally conductive relation with a thermoelectric element for providing variable optical states as a function of the current which passes through the thermoelectric element and consequently the temperature which is developed in the latter to which the liquid crystal material is exposed.

Liquid crystals are coming into wider use in display devices of various types. For example, liquid crystal displays are utilized in wrist watches, clocks, calculators, panel meters, multimeters, and industrial controls. The popularity of liquid crystals stems largely from the fact that they can store images and can provide color effects. Additionally, the circuitry for controlling the optical states of liquid crystals is relatively simple and the power levels involved are small. Liquid crystals and some of their applications are described in the following publications: "Liquid Crystals: Perspectives, Prospects and Products", by Edwin Stepke, Electro-Optical Systems Design, February, 1972, page 20; "Liquid Crystals - A Viable New Medium", by Brian Astle, Optical Spectra, July, 1973, page 35; and "Nematic Crystals Come of Age", by Donald H. Baltzer, Electro-Optical Systems Design, January, 1970, page 72 Liquid crystal displays are also discussed in the following U.S. Pat. Nos. 3,622,226; 3,687,515; 3,690,745; 3,772,874; 3,781,085; 3,781,863; 3,786,486; and 3,803,050.

The liquid crystal display devices described in most of the above-mentioned publications and patents utilize a current which flows through the liquid crystal material or an electric field applied across the same to alter the optically visible state of the liquid crystal material. Typically, the liquid crystal materials are optically variable between a transparent or light scattering visible state and, upon the application or removal of a predetermined field, to a second optically visible state wherein the liquid crystal is respectively light scattering or transparent.

An examination of the above references and patents discloses an inherent disadvantage in the semi-conductor display devices which utilize a conductive current or an electrical field to alter the optical states thereof. This disadvantage is in the construction of the display device which is generally complex in nature. Typically, two electrodes, one of which is transparent, are disposed to each side of the liquid crystal material. The arrangement and construction of electrodes results in a complicated structure insofar as manufacturing is concerned and this increases the cost of this type of display device.

SUMMARY OF THE INVENTION

Accordingly, it is an object of the present invention to provide a liquid crystal display device which does not possess the above described disadvantages associated with other forms of commonly known liquid crystal display devices.

It is another object of the present invention to provide a liquid crystal display device which is simple in construction and economical to manufacture.

It is still another object of the present invention to provide a liquid crystal display device which utilizes a thermoelectric element to alter the optical states of the liquid crystal.

It is yet another object of the present invention to provide a liquid crystal display device which exhibits rapidly reversible optical states by reversal of current through a thermelectric element which is in thermally conductive association with the liquid crystal material.

It is a further object of the present invention to provide a liquid crystal thermoelectric display module which exhibits variable optical states by varying the magnitude and direction of a current passed through the module.

It is still a further object of the present invention to provide a multi-segmented display suitable for displaying numerals and/or alphanumeric characters which is formed from a plurality of thermoelectric crystal display elements or modules of the type suggested in the above objects.

In order to achieve the above objects, as well as others which will become apparent hereafter, a thermoelectric display device in accordance with the present invention comprises a thermoelectric element having a surface which exhibits a reversible temperature which is a function of the magnitude and direction of a current passing through said element. A liquid crystal material is provided which is disposed on said surface in thermally conductive relation therewith, said liquid crystal material being variable between different optical states as a function of the temperature to which the same is exposed. In this manner, the optical state which the display device exhibits is a function of the direction and magnitude of a current passing through said thermoelectric element.

In accordance with a presently preferred embodiment, said thermoelectric element includes two dissimilar conductors joined in overlapping relation over a predetermined area to form a junction. Said surface is a surface of one of said conductors substantially coextensive with said predetermined areas forming said junction. Advantageously, said conductors are made from semi-conductor materials. In the presently preferred embodiment, one conductor is a p-type semi-conductor and the other conductor is an n-type semi-conductor. A layer of electrically conductive material may be disposed between the p-type and n-type semi-conductors over said predetermined areas. In this manner, current may be freely reversed through said junction and corresponding variations in optical states of the liquid crystal material may be achieved.

A multi-segmented display may be formed to provide indications of numeric or alphanumeric characters by selective passage of current through one or more of a plurality of junctions arranged in a predetermined manner. For example, seven junctions or thermoelectric units may comprise seven segments arranged in a numeral 8 configuration to form a seven-segment display device.

BRIEF DESCRIPTION OF THE DRAWINGS

With the above and additional objects and advantages in view, as will hereinafter appear, this invention comprises the devices, combinations and arrangements of parts hereinafter described by way of example and illustrated in the accompanying drawings of a preferred embodiment in which.

DESCRIPTION OF THE PREFERRED EMBODIMENT

Figure 1:
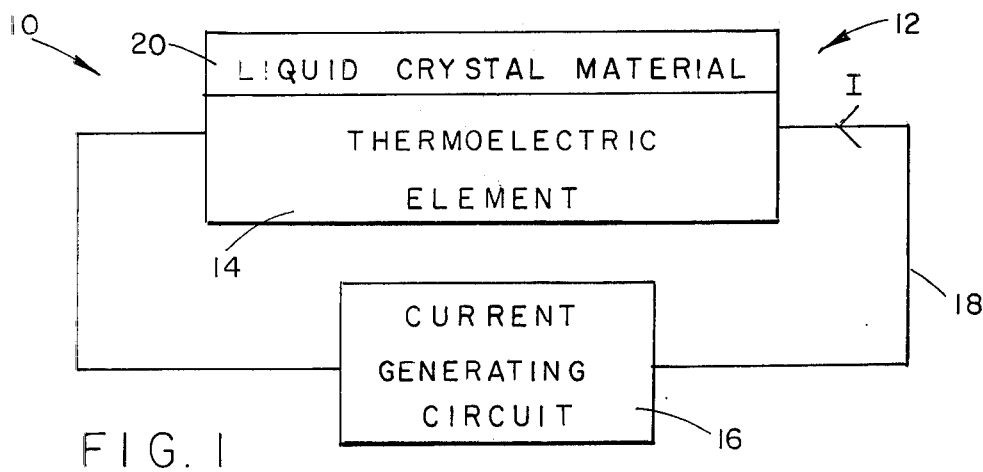
FIG. 1 is a block diagram of a thermoelectric display device in accordance with the present invention, showing schematically a liquid crystal material in contact with a thermoelectric element, with the current passing through the latter being controlled or regulated by a current generating circuit.

Referring now specifically to the FIGS., wherein identical or similar parts have been designated by the same reference numerals throughout, and first referring to FIG. 1, the thermoelectric display device of the present invention is generally indicated by the reference numeral 10.

The display device 10 includes a thermoelectric crystal display module 12, more specifically described in connection with FIGS. 2-4, which includes a thermoelectric element 14 connected to a current generating circuit 16 by means of leads or conductors 18. The current generating circuit 16 can be of any conventional type which can regulate the magnitude and direction of the current I which passes through the thermoelectric element 14.

It is well known that the passage of a current in a metallic conductor results in Joule heating. This heating is an irreversible effect, independent of the current direction. There exist, however, three additional, very closely related reversible effects involving thermal and electrical energies, called thermoelectric effects. These thermoelectric effects are briefly the Seebeck effect, the Peltier effect and the Thomson effect. The thermoelectric effect of interest for the purposes of the present application is the Peltier effect, wherein electric current is maintained across the junction of two dissimilar metals. It is well known that the junction temperature in such an arrangement changes across the junction unless heat is applied or removed by external means. The rate at which heat must be supplied to the junction to maintain its temperature constant is proportional to the current and changes sign when the current direction is reversed. This phenomenon of generation or absorption of heat at junctions of dissimilar metals are characterisic of the Peltier effect. The Peltier effect and the applications thereof are discussed in the following references: Heikes, R. R., and Ure, R. W., Jr., "Thermoelectricity: Science and Engineering, " New York, Interscience Publishers, 1961; MacDonald, D. K. C., "Thermoelectricity: An Introduction to the Principles," New York, John Wiley & Sons, 1962; Goldsmid, H. J., "Applications of Thermoelectricity," London, Methuen & Co., Ltd., 1960. Also of interest are U.S. Pat. Nos. 3,090,207 and 3,255,593. Some of the structural features which are disclosed in the above references in connection with devices utilizing the Peltier effect will be described in connection with FIGS. 2-4.

The thermoelectric element 14 has a surface, indicated schematically as the upper surface of the thermoelectric element represented by the box 14 in FIG. 1, which exhibits a reversible temperature which is the function of the magnitude and direction of the current I which passes through the element 14.

An important feature of the present invention is the provision of a liquid crystal material which is disposed on a surface of the thermoelectric element, which exhibits the reversible temperature, in thermally conductive relation therewith. This is schematically illustrated in FIG. 1. The liquid crystal material is to be of the type which is variable between different optical states as a function of the temperature to which the same is exposed. In this manner, the optical state which the display device exhibits is a function of the direction and magnitude of the current I passing through the thermoelectric element 14. This type of liquid crystal material is known as cholesteric material and is suitable for the present invention since it changes optical states upon being exposed to variable temperatures. As suggested above, the color, reflective or transmissive optical properties of the liquid crystal material may be changed by being exposed to variations in temperature. While cholesteric liquid crystal materials may be utilized, clearly any thermally-sensitive compound which changes optical states responsive to temperature variations may equally be used for the purposes of the present invention.

As to be described in connection with FIGS. 2-5, thermoelectric crystal display devices of the type embodying the above general principle are simple in construction and are particularly suitable for manufacture by conventional printed circuit or deposition techniques.

Figure 2:
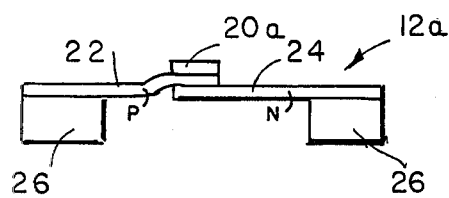
FIG. 2 is a side elevational schematic representation of a thermo-electric crystal display module in accordance with one embodiment of the present invention.

Referring to FIG. 2, a display module 12a is shown which includes two dissimilar conductors 22 and 24 joined in overlapping relation over a predetermined area to form a junction. The two materials 22 and 24 form the thermoelectric element. The surface of the element which exhibits a reversible temperature is the upper surface, as viewed in FIG. 2, of the material 22 which is substantially coextensive with the predetermined areas forming the junction. A liquid crystal 20a is disposed in thermally-conductive relation on the material 22 to thereby become exposed to temperature variations which may occur with changes in magnitude and direction of the current passing through the junction. In this manner, regulation of the current through the junction controls the temperature at the upper surface of the material 22 in the region of the junction and the optical state of the liquid crystal material 20a.

Thermoelectric materials have a figure of merit which is a function of the electrical conductivity, the thermal conductivity and the absolute Seebeck coefficient thereof. All three quantities are a function of the density of free charge carriers in the conductive material. It has been determined that highly doped semiconductors and semi-metals have the highest figures of merit of any of the conductive materials. Also, since best performance is achieved when the two conductive materials have opposite absolute Seebeck coefficients, thermoelectric junctions are normally formed by placing a p-type semi-conductor material and an n-type semi-conductor material in contact with each other. In the embodiment shown in FIG. 2, the conductive material 22 is a p-type semi-conductor and the conductive material 24 is an n-type semi-conductor material. Bismuth telluride is a common material used to form thermoelectric elements.

With the arrangement shown in FIG. 2, reversal of current flow through the junction formed by the p-type and n-type materials 22 and 24 respectively causes a change in the thermal characteristics of the junction, namely changing from a heat generating to a heat absorbing system, or vice versa. Accordingly, the temperature of the junction may either be raised or lowered by simply reversing the direction of current.

Advantageously, heat sinks or heat reservoirs 26 are connected to each of the conductors 22 and 24 in thermally conductive relation therewith at a point remote from the junction. In this manner, heat may flow from or to the heat sinks 26 depending on whether heat is absorbed or generated at the junction.

In the presently preferred embodiment, the conductors 22 and 24 are in the form of planar layers in the region where they overlap to form the junction. The layers advantageously each have a thickness which is smaller than the planar dimensions thereof. In this manner, each of the conductors has a small mass and heat capacity in the region of the junction to thereby permit rapid reversal of temperatures at the surface bearing the liquid crystal material and correspondingly rapid variations of optical states of the liquid crystal material. It should be clear that a thermoelectric crystal display module of the type being described having a short time constant for changing the optical state of the liquid crystal material is advantageous in numerous display devices. While not drawn to scale, the heat sinks 26 in FIG. 2 are advantageously much more massive than the conductive materials 22 and 24 so that the heat sinks may act as a reservoir or sink for heat which is generated or absorbed at the junction.

The liquid crystal material 20a in FIG. 2 may be any commercially available material which is responsive to temperature, as suggested above. The liquid crystal material may, for example, be in the form of a paint, a treated paper product, or any other form which may be deposited on a surface of the junction of a thermoelectric element. Clearly, this permits the formation of display modules having various configurations, including simple elongate bars or segments or complex configurations. It is contemplated that the circuitry or electric conductors be formed by conventional printed circuit or vacuum deposition techniques. The liquid crystal layers may be deposited by screen or other printing techniques.

Figure 3:
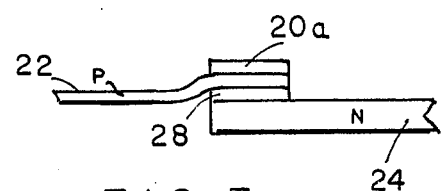
FIG. 3 is an enlarged view of the junction area shown in FIG. 2, showing a modification wherein a conductive layer is disposed between the two semi-conductive layers forming the junction.

Referring to FIG. 3, an electrically conductive layer 28 is shown disposed between the p-type material 22 and the n-type material 24 over the predetermined area of overlap forming the junction. Such an electrically conductive layer 28 may be desirable when oppositely doped semi-conductor materials are utilized to prevent a depletion layer from being formed at the junction with the application of a potential to the conductors. As well known, such a depletion layer may reverse bias the junction and substantially increase the resistance to flow of current in one direction through the junction. While external circuitry may be designed to overcome or compensate for this difference in forward and reverse resistances, it is presently preferred to minimize this depletion layer by the provision of the conductive layer 28. Such a construction results in substantially equal resistances to the flow of current through the junction irrespective of the direction of the current flow therethrough.

Figure 4:
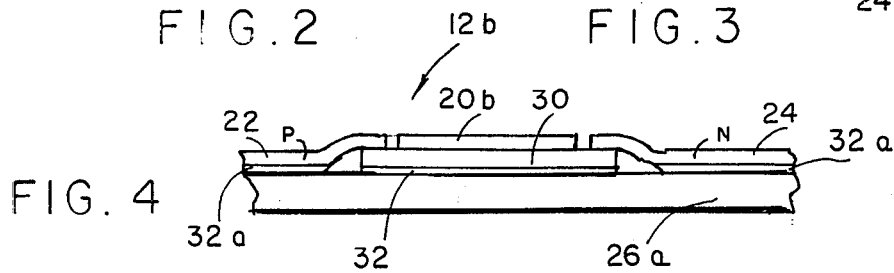
FIG. 4 is a side elevational view of another embodiment of a display module in accordance with the present invention.

A further embodiment 12b of the display module is shown in FIG. 4, wherein a substantially planar heat sink 26a is provided and a layer of electrically conductive material 30 is disposed on the heat sink 26a. An electrically and thermally insulating layer 32 is interposed between the heat sink 26a and the conductive layer 30. The liquid crystal material 20b is deposited or otherwise disposed in thermally conductive relation on the conductive layer 30.

The semi-conductor materials 22 and 24 are in thermally conductive relation to the heat sink 26a by means of electrically insulating but thermally conducting layers 32a. The liquid crystal material 20b is disposed on the conductive layer 30 in heat conductive relation to the latter. In this embodiment, the liquid crystal material 20b covers the conductive layer 30 over the exposed surface area thereof, except for the opposing edges, as shown. The conductive layers 22 and 24 are connected to the conductive layer 30 by overlapping the opposite edges thereof, as shown in FIG. 4.

Electrical current which flows successively through the layers 22, 30 and 24 causes heat to be generated or absorbed at the junction between the p-type and n-type layers 22 and 24 respectively to thereby cause the conductive layer 30 to assume a temperature suitable for achieving a desired optical state of the liquid crystal material 20b. Where an electrically conductive layer 30 is provided which has a conductivity substantially greater than that of the semi-conductor materials 22 and 24, the intermediate layer is insignificant insofar as the thermoelectric effects are concerned and cooling and heating at the junction is substantially the same as though the p-type and n-type layers were superposed or overlapped as shown in FIG. 2. However, because the layers 22 and 24 are separated by a highly conductive layer 30, a depletion layer is prevented from being formed, as with the embodiment shown in FIG. 3.

The display module 12b shown in FIG. 4 is suitable for being fabricated in accordance with printed circuit techniques. Clearly, the various layers may be etched or deposited on the sink 26a with any suitable known technique.

Figure 5:
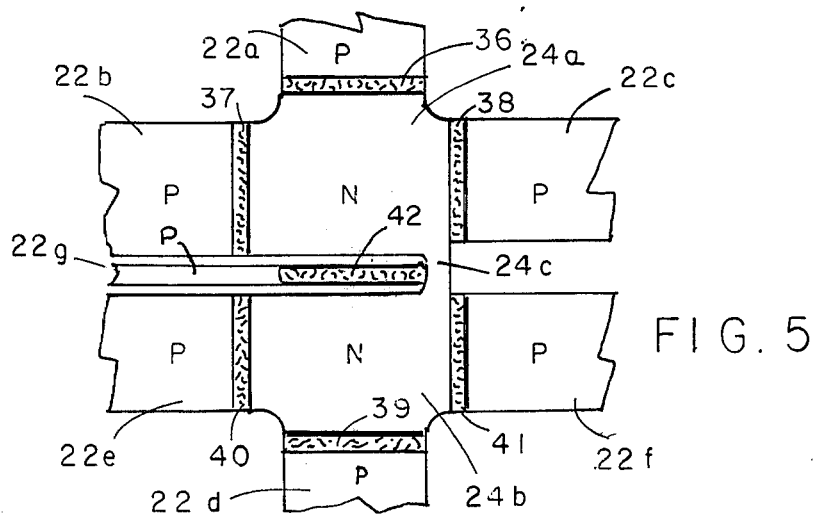
FIG. 5 is a top plan view of a seven segment thermoelectric crystal display module, each segment having a construction similar to one of those shown in FIGS. 2-4, the segments being arranged in a figure eight configuration to form a seven segment numerical display device.

Referring to FIG. 5, a seven segment indicating device 34 is shown, the segments being arranged in a numeral eight configuration to form a seven segment numerical display. The segments are respectively designated by reference numerals 36–42. Each of the segments is formed by overlapping layers of p-type and n-type semi-conductor layers as shown. Each segment may be formed in accordance with any of the embodiments shown in FIGS. 2–4, or any other equivalent construction of a thermoelectric element. Any thermoelectric element may be utilized which has a surface whose temperature is controllable, as described above. The junctions are arranged in any desired configuration to provide a multi-cemented display. The display may, for example, be formed to display numerical or alphanumeric characters. The liquid crystal material is disposed on the surface of each thermoelectric element in thermally conductive relation therewith. In this manner, the liquid crystal material on each element is independently variable between different optical states as a function of the temperature to which the respective thermoelectric elements achieves or exhibits. The optical stages of the liquid crystal materials on one or more elements is a function of the directions and magnitudes of the currents passing through the respective thermoelectric elements. As well known, for example, a seven segment display may be utilized to form all the numerical characters by selective changes in optical states of one or more segments in the display device 34.

In accordance with the presently preferred embodiment, the indicating device 34 is in the nature of a module which is formed in accordance with integrated circuit techniques. The n-type material 24a is in the nature of a single land which is common to all the segments 36–42 and forms part of the respective junction or segment, as suggested in FIGS. 2–4. The junction is completed by a plurality of p-type semi-conductors 22a–22f which independently lead to each segment. In this manner, control of each respective junction is achieved by controlling the magnitude and direction of current flow through the respective p-type conductor and the n-type material.

It should be be clear from the above description that the thermoelectric display device of the present invention is simple in construction and economical to manufacture. The liquid crystal material which is to be utilized may be in any commercially available form and may be painted on, deposited or cemented to the thermoelectric element surfaces. This results in each of handling, application and use of the crystal material as well as the thermoelectric-crystal display modules. By using encapsulated liquid crystals, for example, the resulting modules have a long shelf life by minimizing surface contamination and giving protection from ultra-violet light. A particular advantage of the present invention is the reversibility in thermal operation. It is known, for example, that the optical states of the liquid crystal materials may be reversed over one-million cycles without indication of fatigue. The display modules of the present invention also reduce the angular dependence of the color observed since the liquid crystal materials are exposed on top of the thermoelectric elements and projects above the upper surface of the latter. This is opposed to prior art constructions wherein the liquid crystal material was generally encapsulated or enclosed between electrodes and generally contained in cavities of a structure.

Simultaneous use of more than one type of liquid crystal results in a structure which responds in different temperature ranges. This provides added flexibility in the nature or quality of the optical states which the display modules may exhibit.

As suggested above, the junctions themselves may be formed in any desired configuration. By coating the resulting junctions with liquid crystal material, permanent geometrical designs may be formed. This further enhances the value of the display device in the advertising and display fields. Geometrical designs having simple or complex configurations may be formed since the liquid crystal systems may be deposited on film or paper substrates or directly on the junctions themselves.

As should be clear from the above, the thermoelectric display device of the present invention permits the resulting display modules to provide one optical state, such as transparent or opaque and, by simply reversing the current through the thermoelectric element, effectively erase the original optical state and cause another or opposing optical state to be formed on the module. Thus, an opaque liquid crystal layer may be made transparent by reversal of current. A transparent liquid crystal material may similarly be made opaque by reversal of current through the thermoelectric element. Alternately, by appropriate selection of the liquid crystal material, the module may continuously display opacity, exhibit different colors with suitable application of current. For example, liquid crystal materials exist which are responsive to temperature variations and which exhibits greatly enhanced color brilliance. All colors, including reds, yellows, greens and blues are possible. For example, passage of current through the thermoelectric element in one direction may cause the liquid crystal material to start at the red end of the spectrum and turn blue while reversal of the current reverts the liquid crystal material from the blue to the red. Changes in colors between any two colors of the spectrum are made possible by suitable control of the current passing through and therefore the temperature of the thermoelectric element.

Numerous alterations of the structure herein disclosed will suggest themselves to those skilled in the art. However, it is to be understood that the present disclosure relates to a preferred embodiment of the invention which is for purposes of illustration only and is not to be construed as a limitation of the invention.

What is claimed is:

1. A visual display device comprising a thermoelectric element having a surface which exhibits a reversible temperature which is a function of magnitude and direction of a current passing through said element, a liquid crystal material disposed on said surface in thermally conductive relation therewith, said liquid crystal material being variable between different optical states as a function of temperature to which said liquid crystal is exposed, each optical state which the display device exhibits being a function of the magnitude and direction of the current passing through said thermoelectric element, said thermoelectric element including two dissimilar conductors disposed in overlapping relationship to provide predetermined areas defining a junction, said surface being a part of one of said conductors and being substantially coextensive with said predetermined area defining said junction so that regulation of the current through said junction controls the temperature at said surface and the optical state of said liquid crystal material, a heat sink being connected to each conductor in a thermally conductive relation therewith at a point remote from said junction to permit flow of heat therebetween, said conductors being fabricated from semi-conductor materials, one conductor being a p-type semi-conductor and the other conductor being an n-type semi-conductor, whereby reversal of the current through said junction provided by said p-type and n-type semi-conductors effects a change in thermal characteristic of said junction between a heat generating system and a heat absorbing system to raise and lower the temperature of said surface.

2. A visual display device comprising a thermoelectric element having a surface which exhibits a reversible temperature which is a function of magnitude and direction of a current passing through said element, a liquid crystal material disposed on said surface in thermally conductive relation therewith, said liquid crystal material being variable between different optical states as a function of temperature to which said liquid crystal is exposed, each optical state which the display device exhibits being a function of the magnitude and direction of the current passing through said thermoelectric element, said thermoelectric element including a substantially planar heat sink to permit flow of heat, a layer of electrically conductive material disposed over said heat sink, an electrically insulating layer of material disposed between said heat sink and said layer of electrically conductive material, two semi-conductor layers disposed on said heat sink in thermally conductive relation thereto, each semi-conductor layer overlapping said electrically conductive layer at an opposite portion thereof, said surface being a part of said electrically conductive layer so that an electrical current flow through said semi-conductor layers and said electrically conductive material cuases said electrically conductive material to assume a temperature suitable for achieving a desired optical state of said liquid crystal material which is disposed on said electrically conductive layer, one semi-conductor layer being a p-type semi-conductor and the other conductor being an n-type semi-conductor, whereby reversal of the current through said p-type and n-type semi-conductors effects a change in thermal characteristic of said electrically conductive material between a heat generating system and a heat absorbing system to raise and lower the temperature of said surface.

3. A visual display device as defined in claim 1, further comprising a layer of electrically conductive material disposed between the p-type and n-type semi-conductors over said predetermined areas, whereby said layer of conductive material permits free reversal of current through said junction and corresponding variation in optical states of said liquid crystal material.

4. A visual display device as defined in claim 1, wherein said two conductors are in the form of planar layers in the region of overlap, said layers each having a thicknes smaller than the planar dimensions thereof, whereby each conductor has a small mass and heat capacity in the region of said junction to thereby permit rapid reversal of temperatures at said surface and correspondingly rapid variations of optical states of said liquid crystal material.

5. A visual display device as defined in claim 4, wherein said layers are vacuum deposited layers.

6. A visual display device as defined in claim 1, further comprising current generating means for reversibly driving a current of a predetermined magnitude through said thermoelectric element, whereby an optical state exhibited by said liquid crystal material during current flow in one direction can be erased and a second optical state substituted therefor by reversal of current flow in an opposite direction.

7. A visual display device as defined in claim 2, wherein said two conductors are in the form of planar layers in region of overlap with said electrically conductive layer, said planar layers each having a thickness smaller than the planar dimensions thereof, whereby each conductor has a small mass and heat capacity in the region of said overlap to thereby permit rapid reversal of temperatures at said surface and correspondingly rapid variations of optical states of said liquid crystal material.

8. A visual display device as defined in claim 2, further comprising current generating means for reversibly driving a current of a predetermined magnitude through said thermoelectric element, whereby an optical state exhibited by said liquid crystal material during current flow in one direction can be erased and a second optical state substituted therefor by reversal of current flow in an opposite direction.

* * * * *